United States Patent
Carnick et al.

(10) Patent No.: US 10,667,413 B1
(45) Date of Patent: May 26, 2020

(54) POWER DISTRIBUTION BOX ASSEMBLY WITH TERMINAL TOWER

(71) Applicant: Sumitomo Wiring Systems, Ltd., Yokkaichi, Mie (JP)

(72) Inventors: Brian Carnick, Farmington Hills, MI (US); Bennie Malcom, Farmington Hills, MI (US)

(73) Assignee: Sumitomo Wiring Systems, Ltd., Yokkaichi, Mie (JP)

( * ) Notice: Subject to any disclaimer, the term of this patent is extended or adjusted under 35 U.S.C. 154(b) by 0 days.

(21) Appl. No.: 16/458,714

(22) Filed: Jul. 1, 2019

(51) Int. Cl.
| | | |
|---|---|---|
| *H02B 1/26* | (2006.01) | |
| *H05K 5/00* | (2006.01) | |
| *H05K 1/18* | (2006.01) | |
| *H02G 3/08* | (2006.01) | |
| *B60R 16/023* | (2006.01) | |
| *H01R 9/22* | (2006.01) | |

(52) U.S. Cl.
CPC ....... *H05K 5/0069* (2013.01); *B60R 16/0238* (2013.01); *H02B 1/26* (2013.01); *H02G 3/083* (2013.01); *H05K 1/18* (2013.01); *H05K 5/0052* (2013.01); *H01R 9/226* (2013.01); *H05K 2201/10272* (2013.01); *H05K 2201/10303* (2013.01)

(58) Field of Classification Search
None
See application file for complete search history.

(56) References Cited

U.S. PATENT DOCUMENTS

| | | | | |
|---|---|---|---|---|
| 5,882,213 | A * | 3/1999 | Witek | B60R 16/0238 439/755 |
| 6,077,102 | A * | 6/2000 | Borzi | H01R 9/2458 439/364 |
| 6,315,578 | B1 * | 11/2001 | Kasai | H01R 9/2458 439/404 |
| 6,796,808 | B2 * | 9/2004 | Hosoe | H01R 9/226 361/826 |
| 7,099,155 | B2 * | 8/2006 | Kobayashi | B60R 16/0238 165/80.3 |
| 7,830,689 | B2 * | 11/2010 | Nakamura | H02M 7/003 363/141 |
| 8,723,033 | B2 * | 5/2014 | Hara | B60R 16/0238 174/17 R |
| 2004/0029420 | A1 * | 2/2004 | Yamaguchi | H01R 9/2466 439/76.2 |
| 2016/0007492 | A1 * | 1/2016 | Suwa | H05K 7/2089 361/820 |
| 2016/0242305 | A1 * | 8/2016 | Maebashi | B60R 16/0238 |
| 2017/0072802 | A1 * | 3/2017 | Matsumura | H05K 7/026 |

* cited by examiner

*Primary Examiner* — Courtney L Smith
(74) *Attorney, Agent, or Firm* — Honigman LLP

(57) ABSTRACT

A power distribution box assembly is provided. The power distribution box assembly includes an upper housing assembly having a top cover and a lower cover having an upper substrate and an upper terminal housing. The lower cover including a pair of gaps. A bottom cover includes a lower terminal housing and a pair of towers, each of the pair of towers having a terminal support disposed on a top surface of the corresponding pair of towers, wherein each of the terminal support is registered to a corresponding one of the pair of gaps. A bus bar assembly is configured to direct power to the upper housing assembly and the bottom cover.

9 Claims, 5 Drawing Sheets

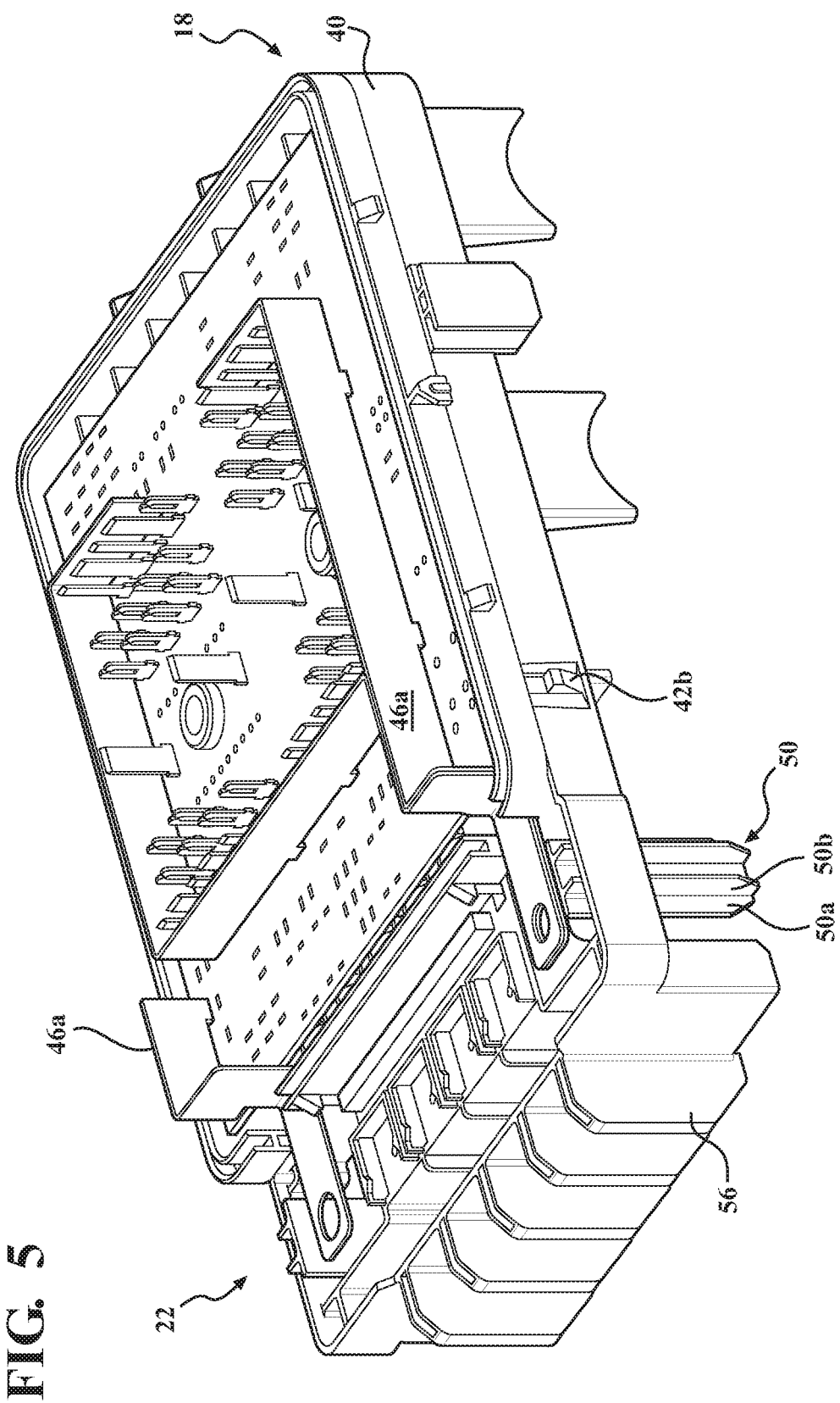

200

POWER DISTRIBUTION BOX ASSEMBLY WITH TERMINAL TOWER

TECHNICAL FIELD

The present specification generally relates to power distribution boxes. In particular, the specification relates to a power distribution box having an upper housing assembly and a bottom cover wherein electrical power is distributed to both the upper housing assembly and the bottom cover.

BACKGROUND

Vehicles such as automobiles may include a power distribution box assembly. The power distribution box assembly may be disposed in an engine bay trunk or any other suitable location of the automobile. The size of power distribution boxes have increased with an increase in electrical functions as a result of developed technology such as autonomous driving, infotainment and the like.

However, packaging constraints within an automotive vehicle may limit the size of the power distribution box. In other words, the power distribution box must compete with other vehicle components for space. Thus, accommodating the necessary electric components to support the electric functions within the power distribution box may be difficult.

Currently power distribution boxes may include a connector assembly disposed on a bottom cover. A plurality of bus bars electrically connect electrical components within the bottom cover to electric components disposed in the upper housing assembly. The added electric functions also increases the length of the electric bus bars, and the electric bus bars compete with the packaging space available within the power distribution box itself.

Accordingly, it remains desirable to have a power distribution box configured to limit the packaging size of the power distribution box but accommodate the increase in electrical components needed to support additional vehicle functions.

SUMMARY

A power distribution box assembly is provided. The power distribution box assembly includes an upper housing assembly. The upper housing assembly includes a top cover and a lower cover. The lower cover includes an upper substrate and an upper terminal housing. A pair of gaps are disposed on the upper substrate.

The power distribution box assembly further includes a bottom cover. The bottom cover includes a lower terminal housing and a pair of towers. Each of the pair of towers has a terminal support disposed on a top surface of the pair of towers. Each of the terminal supports is registered to a corresponding one of the pair of gaps.

A lower bus bar is disposed in the bottom cover. The lower bus bar includes a base portion and a pair of prongs. The base portion is fitted onto a lower substrate of the bottom cover and the pair of prongs are configured to be disposed on the pair of towers. Each of the prongs include an engagement end dimensioned so as to mount onto the terminal supports of each of the pair of towers so as to provide an electrical path to both the bottom cover and upper housing assembly thus minimizing the packaging requirements of the power distribution box assembly.

In one embodiment, the pair of towers includes a slanted wall and the prongs are angled so as to be seated against the slanted walls.

In another embodiment the lower cover includes a pair of ribs and the towers have a side wall. The side walls includes a slot configured to receive the ribs so as to seat the lower cover onto the bottom cover.

In another embodiment, the power distribution box assembly includes a printed circuit board and a pair of upper bus bars. The printed circuit board is mounted to the lower cover and each of the upper bus bars are electrically connected to a corresponding engagement end of the pair of prongs wherein power supplied to the hard distribution box is distributed to the printed circuit board as well as the electric components disposed in the bottom cover.

In another embodiment, the power distribution box assembly includes an electric component disposed on a bottom surface of the bottom cover. The lower bus bar electrically connects the lower terminal housing of the bottom cover to the electric component. In such embodiment, the electric component may be a switch configured to switch the power distribution box between a first power source and a second power source wherein the first power source supplies a voltage different than the second power source.

Accordingly, a power distribution box assembly is provided which reduces the surface area of the bus bar relative to current power distribution box assemblies and provides electric power to the upper housing assembly and the bottom cover.

BRIEF DESCRIPTION OF THE DRAWINGS

The embodiments set forth in the drawings are illustrative and exemplary in nature and not intended to limit the subject matter defined by the claims. The following description of the illustrative embodiments can be understood when read in conjunction with the following drawings, where like structure is indicated with like reference numerals and in which:

FIG. 5 is perspective view of the lower cover.

DETAILED DESCRIPTION OF PREFERRED EMBODIMENTS

Referring generally to the figures, embodiments of the present disclosure directed towards a powered distribution box assembly are provided. The power distribution box assembly may be disposed in an automotive vehicle so as to provide power to various vehicle functions. For instances, the power distribution box assemble may be disposed in an engine bay under a hood of the vehicle so as to distribute power to various vehicle components such as wind shield wipers, head lamps, cameras, side mirrors, and the light.

The power distribution box assembly includes an upper housing assembly and a bottom cover. The upper housing assembly is configured to hold electric components regulating voltage to various vehicle components. The bottom cover is configured to house a connector assembly. The connector assembly is configured to direct power to various vehicle components such as the windshield wipers, side mirror and other various components described above. The bottom cover includes a pair of towers having a terminal support disposed on a top surface of the towers. The upper housing assembly includes a lower cover having an upper substrate and upper terminal housing. The lower cover includes a pair of gaps. The towers are registered to each of the gaps and a lower bus bar is configured to provide power to both the upper housing assembly and the bottom cover. Accordingly, the power distribution box assembly reduces the surface area of the bus bar relative to current power distribution box assemblies and provides electric power to the upper housing assembly and the bottom cover.

Figure 1:
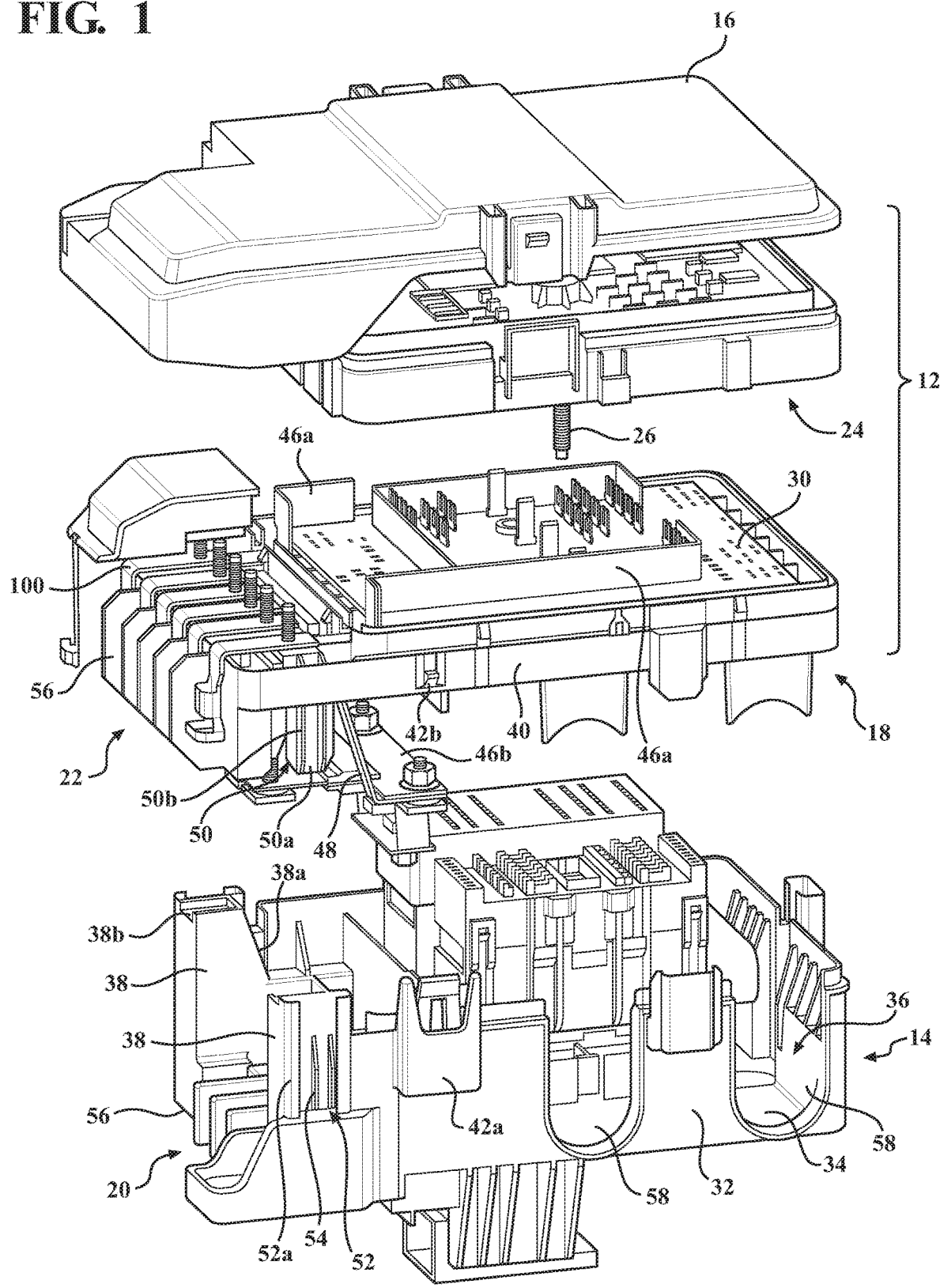
FIG. 1 is an exploded view of a power distribution box assembly.

With reference now to FIG. 1, a perspective view of an illustrative embodiment of a power distribution box assembly 10 is provided. The power distribution box assembly 10 includes an upper housing assembly 12 and a bottom cover 14. Preferably, the upper housing assembly 12 and the bottom cover 14 are made of a material suitable for use in the injection molding process, illustratively including polypropylene, polyamide and the like.

The upper housing assembly 12 includes a top cover 16 mounted to a lower cover 18. Conventional fasteners may be disposed on the top cover 16 and the lower cover 18 so as to releasably secure the top cover 16 to the lower cover 18. Any conventional fastener currently used or later developed may be used herein without deviating from the scope of the appended claims.

The upper housing assembly 12 is configured to cover the bottom cover 14. Conventional fasteners may be disposed on the upper housing assembly 12 and the bottom cover 14 so as to releasably secure the upper housing assembly 12 to the bottom cover 14. Any conventional fastener currently used or later developed may be used herein without deviating from the scope of the appended claims. The bottom cover 14 includes a lower terminal housing 20 and the upper housing assembly 12 includes an upper terminal housing 22.

A case 24 is fitted between the top cover 16 and the lower cover 18. The case 24 is configured to hold various electric components for the distribution and regulation of power such as relay switches, fuses, capacitors, and alike. The case 24 may be secured to the lower cover 18 using a conventional threaded stud 26.

The lower cover 18 includes an upper substrate 28 configured to support a printed circuit board 30. For illustrative purposes, the upper terminal housing 22 is shown disposed on the front end of the lower cover 18. The upper terminal housing 22 is illustratively shown as supporting four (4) electric terminals (not shown).

Figure 2:
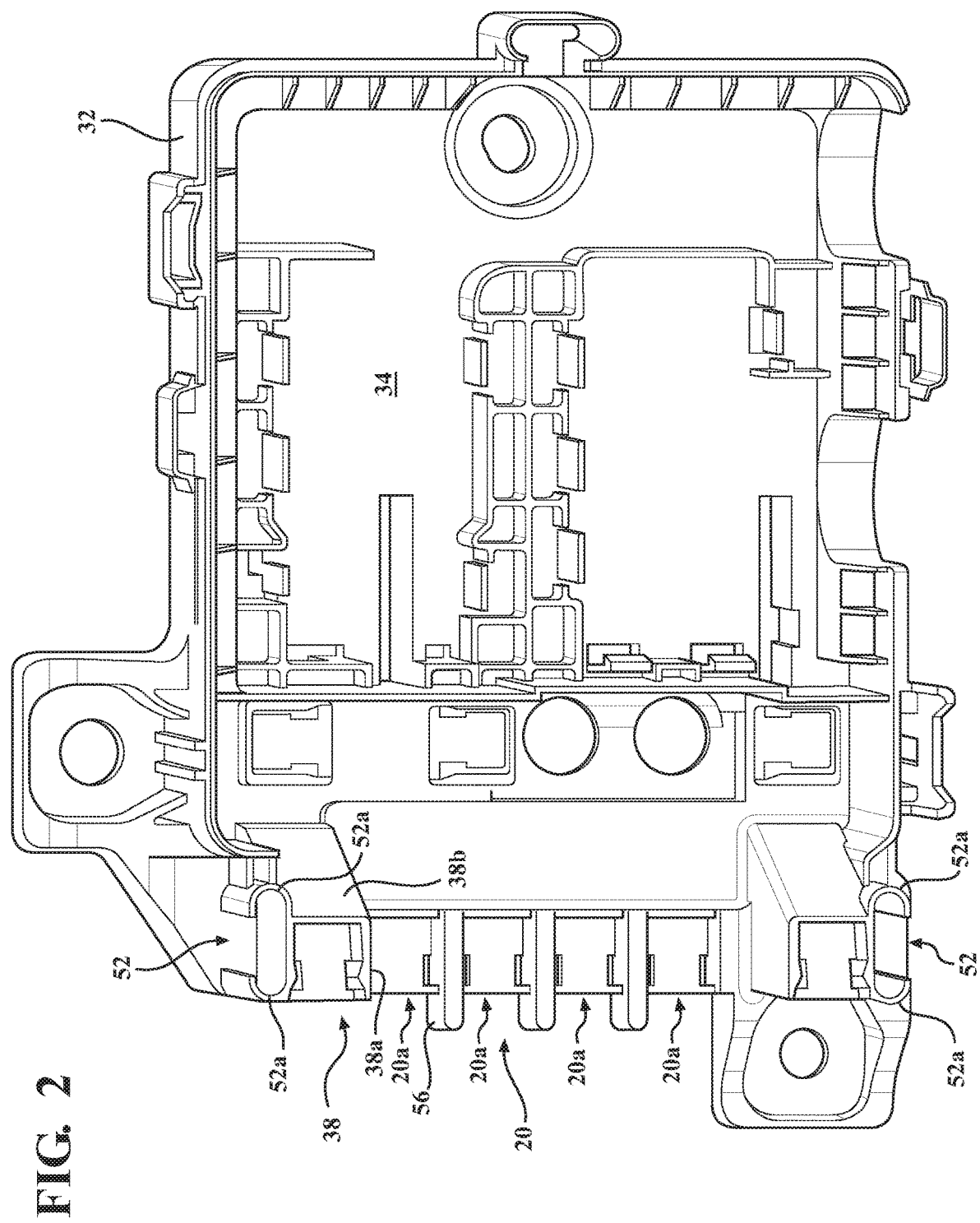
FIG. 2 is a top down view of the bottom cover.

With reference now to FIG. 2, perspective view of the bottom cover 14 is provided. The bottom cover 14 includes a bottom wall 32 extending generally orthogonal to a lower substrate 34 so as to define a bottom storage space 36. The lower terminal housing 20 is illustratively shown as being disposed on a front side 14*a* of the bottom cover 14 so as to be positioned underneath the upper terminal housing 22 when the powered distribution box assembly is assembled as shown in FIG. 1. The lower terminal housing 20 and the upper terminal housing 22 are illustratively shown as being open to the environment so as to facilitate the installation of the electric terminals.

The lower terminal housing 20 is adjacent the bottom storage space 36, separated by a portion of the bottom wall 32. The bottom cover 14 further includes a pair of towers 38. The towers 38 are disposed on opposite sides of the lower terminal housing 20 so as to be generally axially aligned with the lower terminal housing 20. The towers 38 include a back wall 38*a*. The back wall 38*a* is illustratively shown as being slanted however, it should be appreciated that the back walls 38*a* may be orthogonal to the lower substrate 34. The top surface of each of the towers 38 have a U-shaped wall which is open to the back of the lower cover 18 so as to define a terminal support 38*b*. The terminal support 38*b* is configured to receive an electric terminal, as illustratively shown in FIG. 4.

Figure 3:
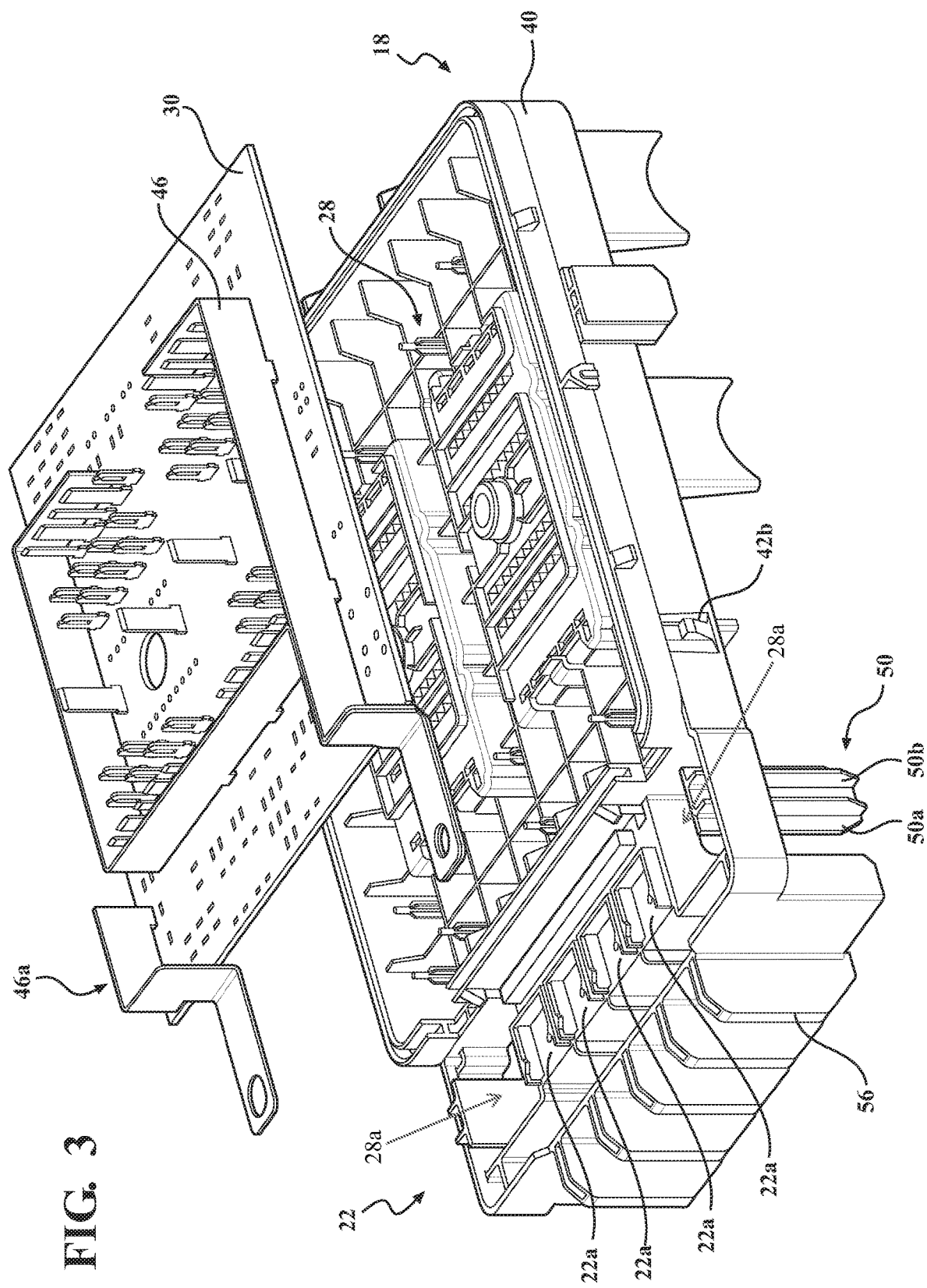
FIG. 3 is a view showing a printed circuit board and the lower cover.
Figure 4:
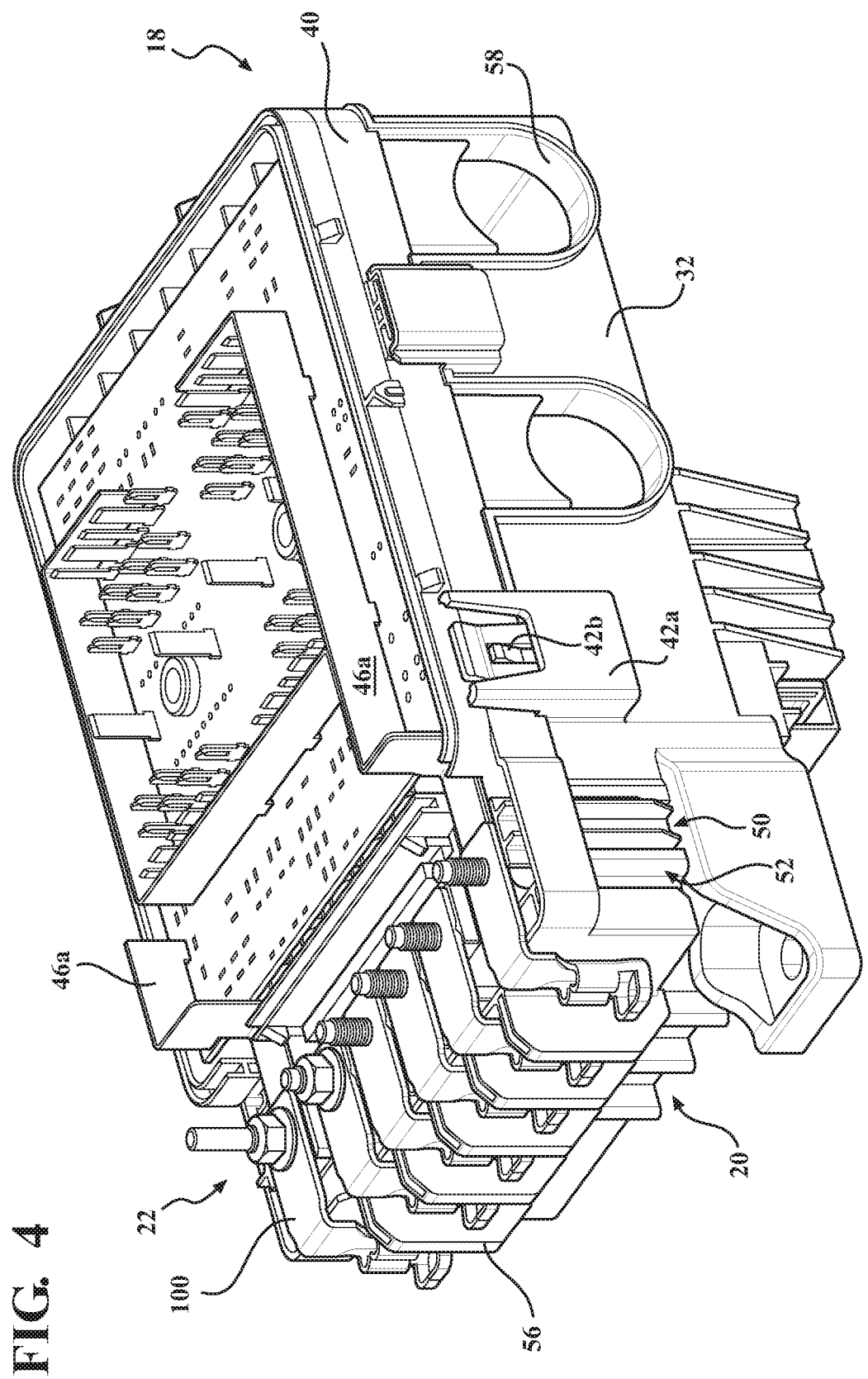
FIG. 4 is view showing the lower cover mounted to the bottom cover.

With reference now to FIGS. 3 and 4, a description of the lower cover 18 is provided. The lower cover 18 further includes a lower wall 40 bounding the peripheral edge of the upper substrate 28. FIG. 3 is an exploded view of the lower cover 18 and the printed circuit board 30. FIG. 4 shows the lower cover 18 mounted to the bottom cover 14. As shown, the lower cover 18 is dimensioned to cover the bottom cover 20. A latch 42*a* is disposed on the exterior of the bottom wall 32 of the bottom cover 14 and is shown to engage a tab 42*b* disposed on the lower wall 40 of the lower cover 18 in a snap fit engagement. The lower cover 18 covers the bottom cover 14 so as to protect the electric components housed therein.

The upper substrate 28 includes a plurality of partitions 44 configured to hold various electronic components (not shown). A portion of the upper substrate 28 is configured to be seated with a pair of terminal connector assemblies (not shown). The printed circuit board 30 is fitted onto the upper substrate 28 and includes a plurality of pin-holes for accommodating electric terminals.

The power distribution box assembly 10 further includes a bus bar assembly 46. The bus bar assembly 46 includes a pair of upper bus bars 46*a* and a lower bus bar 46*b*. The upper bus bars 46*a* are configured to be seated onto the printed circuit board 30. The upper bus bars 46*a* are illustratively shown as having different dimensions. Each of the upper bus bars 46*a* is configured to be coupled to a respective tower 38. The lower bus bar 46*b* (shown in FIG. 1) is configured to provide power from a power source (not shown) to the lower terminal housing 20. A pair of prongs 48 are configured to direct power from the lower bus bar 46*b* to the electric terminals coupled to respective terminal supports 38*b* disposed on the towers 38.

The lower cover 18 includes a pair of ribs 50. The ribs 50 are disposed within a respective gap 28*a* of the upper substrate 28. The ribs 50 are fixed to the lower wall 44 and are disposed adjacent the front end of the lower cover 18. The ribs 50 include an elongated finger 50*a* having a pair of fins 50*b*. The ends of the ribs 50 are angled so as to facilitate mounting the lower cover 18 onto the bottom cover 14.

With reference again to FIG. 2, the bottom cover 14 includes a pair of slots 52. The slots 52 are disposed on the outer surfaces of a respective tower 42. Each slot 52 is formed by a pair of elongated members 52*a* opposite of each other. The elongated members 52*a* have an arcuate inner surface so as to define a generally ovoid cross-section which is open along the height of the elongated members 52*a*. The slots 52 are illustratively shown as being directly opposite each other, but may be offset from each other to accommodate packaging needs.

The slots 52*a* further includes a pair of guide ribs 54 are configured to be generally centered between the pair of elongated members 54*a*. The guide ribs 54 work in concert with the ribs 50 of the lower cover 18 to help retain the lower cover 18 to the bottom cover 14. In particular as the lower cover 18 is fitted onto the bottom cover 14. The ribs 50 are slid into respective slots 54 of the towers 38 and the guide rib 56 of the slots 54 cooperate with the fins 50*a* of the ribs 50 so as to generate a pinch fit engagement and help secure the lower cover 18 to the bottom cover 14.

With reference again to FIG. 3 an exploded view of the lower cover 18 is provided. FIG. 3 shows an embodiment where the upper terminal housing 22 includes four (4) terminal cavities 22*a* configured to support a corresponding number of eyelet terminals 100 (shown in FIG. 4). It should be appreciated that the number of terminal cavities 22*a* in the power distribution box assembly 10 may be modified herein without deviating from the scope of the appended claims.

The terminal cavities 22*a* are general shown as having a "U" shape partition. The "U" shape partitions are open to the front end of the lower cover 18 and are positioned axially with respect to each other. A plurality of separating ribs 56 are disposed on a front wall of the lower cover 18. The separating ribs 56 are spaced apart from each other so as to accommodate the eyelet terminal 100 and limits the rotation of the eyelet terminals 100 and prevent a short circuit from occurring.

With reference now again to FIG. 2, a top down view of the bottom cover 14 is provided. The bottom cover 14 is configured to hold a pair of connector assembly. A pair of "U" shape openings 58 are form on a side wall of the bottom cover 14. The "U" shape openings 58 are dimensioned to house a wire harness connected to the connector assembly. The lower terminal housing 20 is shown as being configured to seat four (4) lower eyelet terminals 20*a*. The towers 38 are spaced apart from each other and the lower eyelet terminal housing 20 is disposed between the pair of towers 38.

With reference now to FIGS. 1-5, a description of the operation of the power distribution box assembly 10 is provided. The power distribution box assembly 10 may be coupled to a first and a second power source (not shown). For instance, the power distribution box assembly 10 may be configured to receive power from a 12 volt source and a 48 volt source. An electric component may be disposed on a bottom surface of the bottom cover 14 wherein the electric component is a switch configured to switch between the first power source and the second power source.

Power is supplied to the lower bus bar 46*b*. The power is routed through the legs of the lower bus bar 46*b* and is coupled to respective electric terminals which are seated within the terminal cavities of the lower terminal housing 20. The lower bus bar 46*b* is electrically connected to the upper housing assembly 12 by the pair of prongs 62 which extends upwardly into the gaps of the lower cover 18 as illustratively shown in FIG. 3.

The upper bus bars 46*a* are coupled to the pair of prongs 48 which are seated on the terminal support of the towers 38, accordingly power is distributed from the power source to the pair of upper bus bars 46*a*, which directs power to the connector assemblies. The power is regulated by the various electronic components mounted to the printed circuit board 30. Thus power is provided to the printed circuit board 30.

FIG. 3 shows four (4) eyelet terminals seated on the respective terminal cavities 22*a* of the upper terminal housing 22. Thus power may be provided to other various electric components within the automotive system. Likewise, the lower terminal housing 22 is configured to receive four (4) eyelet terminals (as shown in FIG. 2). The lower bus bar 46*b* is configured to provide a conductive path to the eyelet terminals so as to also power other various electric components within the automotive system.

Accordingly, a power distribution box assembly 10 assembly is provided having a bottom cover 14 and a lower cover 18 configured to distribute power to electric components disposed both within the upper housing assembly 12 and the bottom cover 14 as well as to route power to an underside of the bottom cover 14 of the power distribution box assembly 10 allowing a switch to switch between the first and second power source and wherein eyelet terminals mounted to the upper and lower terminal housing 20 may distribute power to other vehicle functions.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A power distribution box assembly comprising:
    an upper housing assembly having a top cover and a lower cover having an upper substrate and an upper terminal housing, the lower cover including a pair of gaps; and
    a bottom cover, the bottom cover having a lower terminal housing and a pair of towers, each of the pair of towers having a terminal support disposed on a top surface of the corresponding pair of towers, wherein each of the terminal support is registered to a corresponding one of the pair of gaps; and
    wherein the upper terminal housing is disposed between the pair of gaps and the lower terminal housing is disposed between the pair of towers.

2. The power distribution box assembly of claim 1, wherein each of the pair of towers includes a slanted wall.

3. The power distribution box assembly of claim 2, wherein each of the pair of towers includes an outer wall open to an exterior of the bottom cover, the outer wall having a slot extending along a height of the bottom cover, the lower cover including a pair of ribs configured to be seated within each of the slots.

4. The power distribution box assembly of claim 3, further including a lower bus bar, the lower bus bar having a base portion and a pair of prongs, the base portion disposed on a lower substrate of the bottom cover and the pair of prongs are configured to be disposed on a corresponding one of the pair of towers, wherein each of the pair of prongs include an engagement end, each of the engagement ends are mounted on a corresponding one of the pair of terminal supports the lower bus bar providing an electrical path to both the bottom cover and the upper housing assembly.

5. The power distribution box assembly of claim 4, wherein the pair of prongs are angled with respect to the base portion.

6. The power distribution box assembly of claim 5, further including a printed circuit board and a pair of upper bus bars, the printed circuit board mounted to the lower cover and each of the pair of upper bus bars are electrically connected to a corresponding one of the pair of engagement ends of the pair of prongs.

7. The power distribution box assembly of claim 6, wherein the bottom cover is configured to house a connector assembly.

8. The power distribution box assembly of claim 7, wherein the connector assembly is a pair of connector assemblies.

9. The power distribution box of claim 8, wherein a lower bus bar electrically connects the lower terminal housing to an electric component disposed on a bottom surface of the bottom cover.

\* \* \* \* \*